United States Patent
Halliyal et al.

(10) Patent No.: US 6,265,268 B1
(45) Date of Patent: Jul. 24, 2001

(54) HIGH TEMPERATURE OXIDE DEPOSITION PROCESS FOR FABRICATING AN ONO FLOATING-GATE ELECTRODE IN A TWO BIT EEPROM DEVICE

(75) Inventors: Arvind Halliyal, Sunnyvale; Robert B. Ogle, San Jose; Hideki Komori, Santa Clara; Kenneth Au, Fremont, all of CA (US)

(73) Assignees: Advanced Micro Devices, Inc., Sunnyvale, CA (US); Fujitsu, Ltd., Kanagawa (JP)

( * ) Notice: Subject to any disclaimer, the term of this patent is extended or adjusted under 35 U.S.C. 154(b) by 0 days.

(21) Appl. No.: 09/426,672

(22) Filed: Oct. 25, 1999

(51) Int. Cl.$^7$ ............................................. H01L 21/8247
(52) U.S. Cl. ........................................... 438/261; 438/287
(58) Field of Search ................................... 438/261, 265, 438/287, 257–267

(56) References Cited

U.S. PATENT DOCUMENTS

| | | | |
|---|---|---|---|
| 5,104,819 | * | 4/1992 | Freiberger et al. . |
| 5,120,672 | * | 6/1992 | Mitchell et al. . |
| 5,168,334 | | 12/1992 | Mitchell et al. ............... 257/324 |
| 5,836,772 | * | 11/1998 | Chang et al. ................... 438/265 |
| 6,063,666 | * | 5/2000 | Chang et al. ................... 438/261 |
| 6,074,917 | * | 6/2000 | Chang et al. ................... 438/261 |

FOREIGN PATENT DOCUMENTS

| | | |
|---|---|---|
| 3032364 A1 | 4/1982 | (DE) . |
| WO 82/04162 | 11/1982 | (WO) . |

OTHER PUBLICATIONS

International Search Report, International Application No. PCT/US00/28696, International Filing Date Oct. 16, 2000, 4 pp.

Ting, W., et al., "Thin stacked oxide/nitride/oxide dielectrics formation by *in situ* multiple reactive rapid thermal processing," *Applied Physics Letters*, vol. 55, No. 22, Nov. 27, 1989, pp. 2313–2315.

Misra, Veena et al., "Electrical Properties of Composite Gate Oxides Formed by Rapid Thermal Processing, " *IEEE Transactions of Electron Devices*, vol 43, No. 4, Apr. 1996, pp. 636–646.

"2 Bit/Cell EEPROM Cell Using Band–to–Band Tunneling for Data Read–Out," *IBM Technical Disclosure Bulletin*, vol. 35, No. 4B, Sep. 1992, pp. 136, 140.

* cited by examiner

Primary Examiner—Richard Booth
(74) Attorney, Agent, or Firm—Brinks Hofer Gilson & Lione

(57) ABSTRACT

A process for fabricating an ONO floating-gate electrode in a two-bit EEPROM device includes the formation of a top oxide layer using a high-temperature-oxide (HTO) deposition process in which the HTO process is carried out at a temperature of about 700 to about 800° C. by either an LPCVD or RTCVD deposition processor. The process further includes the sequential formation of a silicon nitride layer and a top oxide layer using an in-situ LPCVD or RTCVD deposition process in which the silicon nitride layer is not exposed to ambient atmosphere prior to the formation of the top oxide layer. The formation of the top oxide layer using an HTO deposition process provides an improved two-bit EEPROM memory device by reducing charge leakage in the ONO floating-gate electrode.

21 Claims, 1 Drawing Sheet

Figure 1:
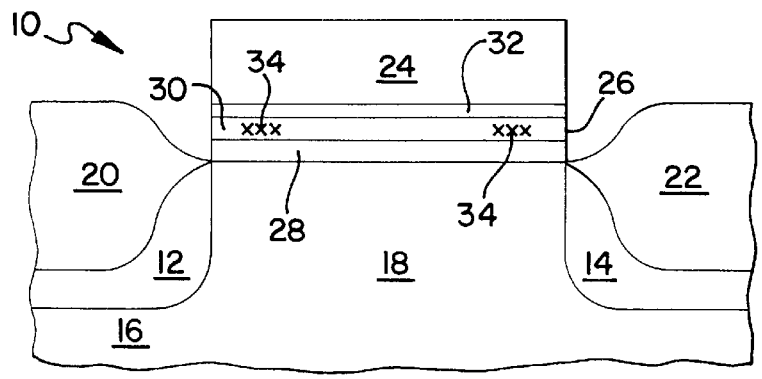

HIGH TEMPERATURE OXIDE DEPOSITION PROCESS FOR FABRICATING AN ONO FLOATING-GATE ELECTRODE IN A TWO BIT EEPROM DEVICE

CROSS REFERENCE TO RELATED APPLICATION

Related subject matter is disclosed in the following co-pending and commonly assigned U.S. patent applications filed on an even date herewith, and are all herein incorporated by reference.

U.S. pat. application Ser. No. 09/426,239. "METHOD TO GENERATE A MONOS TYPE FLASH CELL USING POLYCRYSTALLINE SILICON AS AN ONO TOP LAYER".

U.S. pat. application Ser. No. 09/426,255. "METHOD OF USING SOURCE/DRAIN NITRIDE FOR PERIPHERY FIELD OXIDE AND BIT-LINE OXIDE".

U.S. pat. application Ser. No. 09/433,041. "PROCESS FOR FABRICATING AN ONO STRUCTURE HAVING A SILICON-RICH SILICON NITRIDE LAYER".

U.S. pat. application Ser. No. 09/426,240. "PROCESS FOR FABRICATING AN ONO FLOATING-GATE ELECTRODE IN A TWO-BIT EEPROM DEVICE USING RAPID-THERMAL-CHEMICAL-VAPOR-DEPOSITION", now U.S. Pat. No. 6,180,538.

U.S. pat. application Ser. No. 09/433,136. "PROCESS FOR FABRICATING AN ONO STRUCTURE".

U.S. pat. application Ser. No. 09/433,037. "NITRIDATION PROCESS FOR FABRICATING AN ONO FLOATING-GATE ELECTRODE IN A TWO-BIT EEPROM DEVICE".

U.S. pat. application Ser. No. 09/426,430. "METHOD OF FABRICATING AN ONO DIELECTRIC BY NITRIDATION FOR MNOS MEMORY CELLS",

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid the creation of interface states that could provide charge leakage paths within the ONO layer. Accordingly, advances in ONO fabrication technology are necessary to insure proper charge isolation in ONO structures used in two-bit EEPROM devices.

SUMMARY OF THE INVENTION

The present invention is for a process for fabricating an ONO floating-gate electrode in a two-bit EEPROM device. Fabrication of a two-bit EEPROM device using an ONO floating-gate electrode requires the formation of a high quality ONO structure. This is because proper functionality of the two-bit EEPROM device requires localized charge storage within the ONO structure. In particular, the top oxide layer must have a density sufficient to minimize the formation of charge traps. The formation of charge traps in the top oxide layer can lead to undesirable charge leakage within the top oxide layer and at the interface between the top oxide layer and the underlying silicon nitride layer. In a properly formed ONO structure, all electrical charge is stored in the silicon nitride layer. By fabricating a high quality top oxide layer, stored charge in the ONO structure remains localized within predetermined regions in the silicon nitride layer.

In one form, a process for fabricating an ONO floating-gate electrode includes providing a semiconductor substrate, and thermally growing a first silicon oxide layer on the semiconductor substrate. Then, a silicon nitride layer is formed to overlie the first silicon oxide layer. A second layer of silicon oxide is then formed to overlie the silicon nitride layer using a high temperature oxide (HTO) deposition process. The high temperature oxide deposition process is carried out at a temperature of about 700 to about 800° C.

BRIEF DESCRIPTION

Figure 2:
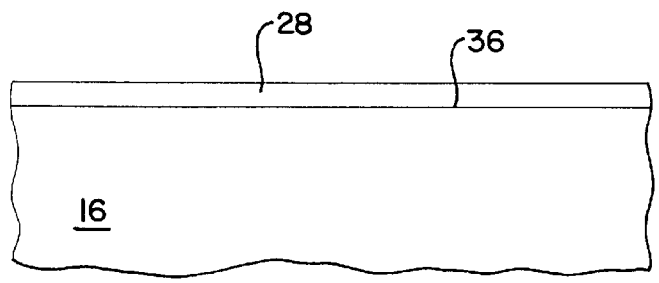
Figure 3:
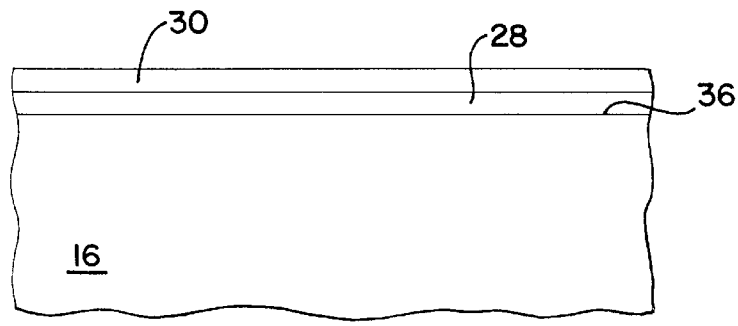
Figure 4:
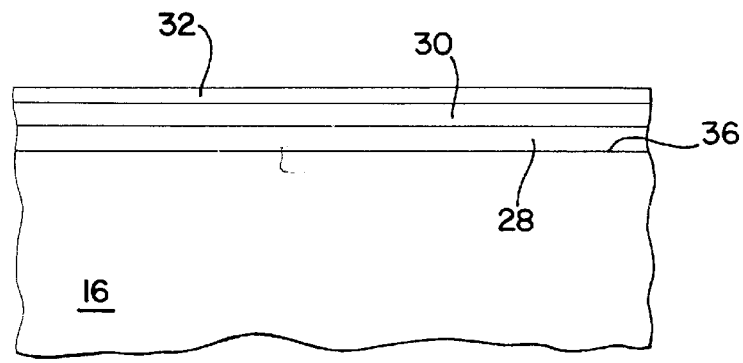

FIG. 1 illustrates, in cross-section, a portion of a semiconductor substrate containing a floating-gate transistor that incorporates an ONO structure fabricated in accordance with the invention; and FIGS. 2–4 illustrate, in cross-section, process steps for the fabrication of an ONO structure in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a floating-gate transistor 10 suitable for use in a two-bit EEPROM device. Floating-gate transistor 10 includes source/drain regions 12 and 14 located in a semiconductor substrate 16 and separated by a channel region 18. First and second bit line oxide regions 20 and 22 overlie source/drain regions 12 and 14, respectively. A control gate electrode 24 overlies channel region 18 and is separated therefrom by an ONO structure 26. Control gate electrode 24 and ONO structure 26 form a stacked-gate structure.

ONO structure 26 includes a first silicon oxide layer 28 overlying channel region 18. A silicon nitride layer 30 overlies first silicon oxide layer 28. A second silicon oxide layer (or top oxide layer) 32 overlies silicon nitride layer 30.

In the operation of floating-gate transistor 10, voltages are applied to control-gate electrode 24 and to source/drain regions 12 and 14 that cause electrical charge from source/drain regions 12 and 14 to propagate across channel region 18. Once the charge encounters a sufficiently strong vertical field, the charge is either injected or tunnels from channel region 18 into silicon nitride layer 30. For example, depending upon the particular voltage levels applied to control-gate electrode 24 and to source/drain regions 12 and 14, electrical charge 34 is transferred into silicon nitride layer 30 and is localized to regions in proximity to either source/drain region 12, or source/drain region 14.

Those skilled in the art will recognize that the proper functioning of a two-bit EEPROM device necessarily requires that electrical charge 34 remain isolated in the regions of silicon nitride layer 30 to which it is initially introduced. The proper maintenance of electrical charge 34 in localized regions of silicon nitride layer 30 is critical to the proper performance of a two-bit EEPROM device. In particular, the quality of ONO structure 26 must be such that charge leakage paths are minimized at the interface between the first and second silicon oxide layers 28 and 32, and silicon nitride layer. Additionally, second silicon oxide layer 32 must be of sufficient density, such that charge trapping sites are minimized within the silicon oxide material.

In accordance with the invention, charge leakage within ONO structure 26 is minimized by forming a high quality top oxide layer. The reduced charge leakage and improved floating-gate transistor performance obtained by the present invention can be better understood following a description of an ONO fabrication process carried out in accordance with the invention.

Referring to FIG. 2, first silicon dioxide layer 28 is formed to overlie the surface of semiconductor substrate 16. Preferably, semiconductor substrate 16 is a single crystal silicon substrate. Semiconductor substrate 16 has an upper surface 36 previously processed to remove debris and native oxides. Preferably, first silicon oxide layer 28 is formed by thermally oxidizing surface 36 at an elevated temperature in the presence of dry molecular oxygen. Preferably, the oxidation process is carried out at a temperature of about 900 to about 1100° C. The oxidation process forms a silicon oxide layer preferably having a thickness of about 50 to about 150 angstroms, and more preferably a thickness of about 100 angstroms. The oxidation process can be carried out in either a batch-type thermal oxidation furnace, or alternatively, in a single-wafer oxidation apparatus.

After forming first silicon oxide layer 28, silicon nitride layer 30 is formed to overlie first silicon oxide layer 28, as illustrated in FIG. 3. Preferably, silicon nitride layer 30 is formed by means of a rapid-thermal-chemical-vapor-deposition (RTCVD) process. The RTCVD process is carried out at a temperature of about 700 to about 800° C. The silicon nitride material is formed by reacting ammonia ($NH_3$) with either dichlorosilane ($SiCl_2H_2$) or silane ($SiH_4$). The processes is carried out for a period of time and at gas flow rates sufficient to form a silicon nitride layer preferably having a thickness of about 50 to about 150 angstroms, and more preferably about 100 angstroms. In one embodiment of the invention, ammonia is introduced in the RTCVD apparatus at a flow rate of about 1 standard liter per minute (slpm) and either dichlorosilane or silane is introduced at a flow rate of about 30 to about 50 standard-cubic-centimeters-per-minute (sccm). The RTCVD process is carried out in three steps including an initial temperature ramp, a deposition step, and cool-down step. Preferably, the total residence time of substrate 16 in the RTCVD apparatus is about 3 minutes. Preferably, the silicon nitride deposition step is completed in about 2 minutes.

Alternatively, silicon nitride layer 30 can be formed by means of a low-pressure-chemical-vapor-deposition (LPCVD) process. In the alternative method, the silicon nitride can be formed in a batch deposition apparatus. The LPCVD process is preferably carried out at a pressure of about 200 to about 500 millitor (mtorr), at temperatures 700–800° C. using ammonia and either dichlorosilane or silane gas.

After forming silicon nitride layer 30, second silicon oxide layer 32 is formed to overlie silicon nitride layer 30, as illustrated in FIG. 4. In accordance with the invention, second silicon oxide layer 32 is formed by either an RTCVD or an LPCVD process. The second silicon oxide layer 32 is formed in an RTCVD apparatus using nitrous oxide ($N_2O$) and dichlorosilane. The RTCVD processes preferably carried out at a temperature of about 700 to about 800° C. and for a total processing time of about 3 minutes. In similarity with the RTCVD process used to deposit silicon nitride layer 30, a three-step deposition sequence is used including a ramp up step, a deposition step, and a cool down step. The total processing time in the RTCVD apparatus is about 3 minutes. Preferably, during the deposition step about 1 to about 3 slpm, and more preferably, about 2 slpm of nitrous oxide is used. Additionally, about 25 to about 75 sccm, and more preferably, about 50 sccm of dichlorosilane is used. The RTCVD process forms a silicon oxide layer having a preferred thickness of about 50 to about 150 angstroms, and more preferably about 100 angstroms. In the LPCVD process, the second oxide is deposited on nitride in a batch type of furnace at temperatures of 700–800° C.

The foregoing RTCVD process for the formation of both the silicon nitride layer and the top oxide layer advantageously provides an in-situ process for the sequential formation of individual layers within the ONO structure. In particular, the formation of silicon nitride layer 30 and second silicon oxide layer 32 in a sequential, in-situ deposition sequence, minimizes contamination at the silicon nitride/silicon oxide interface. Additionally, uncontrolled native oxidation can be reduced to insure that a single, high-density silicon oxide layer is deposited over silicon nitride layer 30.

An important aspect of the invention includes the sequential formation of silicon nitride layer 30 and second silicon oxide layer 32 in the absence of exposure of silicon nitride layer 30 to ambient atmosphere. Following the deposition of silicon nitride layer 30 onto first silicon oxide layer 28, substrate 16 is transferred to an oxide deposition chamber under vacuum conditions without exposing the substrate to ambient atmosphere. Alternatively, a positive-pressure inert gas atmosphere can be introduced during wafer transfer. The in-situ nitride and oxide deposition response can be carried out in a batch-type LPCVD system.

Those skilled in the art will appreciate that various means exist for insuring that silicon nitride layer 30 is not exposed to ambient atmosphere prior to the deposition of second silicon oxide layer 32. For example, a cluster/tool apparatus can be used in which semiconductor substrate 16 is transferred from a nitride deposition chamber to an oxide deposition chamber in a continuous vacuum environment, or in a positive pressure inert gas atmosphere. Alternatively, the nitride deposition and oxide deposition processes can be sequentially carried out in a single deposition chamber that is configured to receive various processing gases. Accordingly, all such variations and modifications are contemplated in the present invention.

Following the formation of ONO structure 26, the stacked-gate structure shown in FIG. 1 is completed by depositing a layer of gate forming material overlying second silicon oxide layer 32. A lithographic patterning and etching process is then carried out to define control-gate electrode 24 and an ONO floating-gate electrode. Those skilled in the art will recognize that various gate-forming materials can be used to fabricate control-gate electrode 24. For example, control-gate electrode 24 can be formed with polycrystalline silicon, amphorous silicon, a refractory metal silicide, and the like.

Thus, there has been disclosed in accordance with the invention a process for fabricating an ONO floating-gate electrode in a two-bit EEPROM device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating an ONO floating-gate electrode in a two-bit EEPROM device comprising the steps of:

providing a semiconductor substrate;

thermally growing a first silicon oxide layer overlying the semiconductor substrate;

forming a silicon nitride layer overlying the first silicon oxide layer; and maintaining at least two charge isolation regions in the silicon nitride layer by depositing a second layer of silicon oxide overlying the silicon nitride layer using a high temperature oxide deposition process, wherein the high temperature oxide deposition process is carried out at a temperature of about 700 to about 800° C.

2. The process of claim 1, wherein the step of depositing a second oxide layer comprises low pressure chemical vapor deposition using nitrous oxide and a second gas selected from the group consisting of silane and dichlorosilane.

3. The process of claim 2, wherein the step of depositing a second oxide layer comprises low pressure chemical vapor deposition using about 0.5 to about 2 slpm nitrous oxide and about 10 to about 50 sccm of the second gas.

4. The process of claim 1, wherein the step of depositing a second oxide layer comprises rapid thermal chemical vapor deposition using nitrous oxide and dichlorosilane.

5. The process of claim 4, wherein the step of depositing a second oxide layer comprises rapid thermal chemical vapor deposition using about 1 to about 3 slpm nitrous oxide and about 25 to about 75 sccm dichlorosilane to form a silicon oxide layer having a thickness of about 50 to about 150 angstroms.

6. The process of claim 1, wherein the step of depositing a silicon nitride layer comprises rapid thermal chemical vapor deposition using about 0.5 to 2 slpm ammonia and about 20 to about 50 sccm of a second gas selected from the group consisting of silane and dichlorosilane.

7. The process of claim 1, wherein the step of forming a silicon nitride layer and the step of depositing a second silicon oxide layer comprises a process selected from the group consisting of RTCVD and LPCVD, wherein the both the silicon nitride layer and the second silicon oxide layer are sequentially formed in a processing apparatus in the absence exposure to ambient atmosphere.

8. A process for fabricating a stacked-gate structure including an ONO floating-gate electrode in a two-bit EEPROM device comprising the steps of:
   providing a semiconductor substrate having a first bit-line oxide layer and a second bit-line oxide layer therein separated by a substrate surface region;
   forming an ONO layer on the substrate surface region by first, thermally growing a first silicon oxide layer on the substrate surface region, second, forming a silicon nitride layer overlying the first silicon oxide layer; and third, maintaining at least two charge isolation regions in the silicon nitride layer by depositing a second layer of silicon oxide overlying the silicon nitride layer using a high temperature oxide deposition process,
   wherein the high temperature oxide deposition process is carried out at a temperature of about 700 to about 800° C.;
   depositing a gate electrode layer overlying the ONO layer; and
   forming a stacked-gate structure on the substrate surface region,
   wherein the stacked-gate structure includes a control-gate electrode overlying an ONO floating-gate electrode.

9. The process of claim 8, wherein the step of depositing a second oxide layer comprises low pressure chemical vapor deposition using nitrous oxide and a second gas selected from the group consisting of silane and dichlorosilane.

10. The process of claim 9, wherein the step of depositing a second oxide layer comprises low-pressure-chemical-vapor-deposition using about 0.5 to about 2 slpm nitrous oxide and about 10 to about 50 slpm of the second gas.

11. The process of claim 8, wherein the step of depositing a second oxide layer comprises rapid thermal chemical vapor deposition using nitrous oxide and dichlorosilane.

12. The process of claim 11, wherein the step of depositing a second oxide layer comprises rapid thermal chemical vapor deposition using about 1 to about 3 slpm nitrous oxide and about 25 to about 75 sccm dichlorosilane to form a silicon oxide layer having a thickness of about 50 to about 150 angstroms.

13. The process of claim 8, wherein the step of depositing a silicon nitride layer comprises rapid-thermal-chemical-vapor-deposition using about 1 slpm ammonia and about 30 to about 50 sccm of a second gas selected from the group consisting of silane and dichlorosilane.

14. The process of claim 8, wherein the step of forming a silicon nitride layer and the step of depositing a second silicon oxide layer comprises a process selected from the group consisting of RTCVD and LPCVD, wherein the both the silicon nitride layer and the second silicon oxide layer are sequentially formed in a processing apparatus in the absence exposure to ambient atmosphere.

15. A process for fabricating an ONO floating-gate electrode in a two-bit EEPROM device comprising the steps of:
   providing a semiconductor substrate having a silicon surface region;
   thermally growing a silicon oxide layer overlying the surface region; and
   depositing a silicon nitride layer overlying the silicon oxide layer and a top silicon oxide layer using a deposition process selected from the group consisting of RTCVD and LPCVD;
   wherein at least two charge isolation regions are maintained in the silicon nitride layer by carrying out the silicon nitride layer and the top silicon oxide layer are sequentially deposited in the absence of exposure to ambient atmosphere; and
   wherein the deposition process is carried out at a temperature of about 700 to about 800° C.

16. The process of claim 15, wherein the step of depositing a second oxide layer comprises an RTCVD process using about 1 to about 3 slpm nitrous oxide and about 25 to about 75 sccm dichlorosilane to form a silicon oxide layer having a thickness of about 50 to about 150 angstroms.

17. The process of claim 16, wherein the RTCVD process comprises a three step sequence including a temperature ramp up step, a deposition step of about 1 minute, and a cool down step.

18. The process of claim 17, wherein the step of depositing a silicon nitride layer using an RTCVD process comprises using about 1 slpm ammonia and about 30 to about 50 sccm of a second gas selected from the group consisting of silane and dichlorosilane.

19. The process of claim 18, wherein the RTCVD process comprises a three step sequence including a temperature ramp up step, a deposition step of about 2 minutes, and a cool down step.

20. The process of claim 19, wherein the RTCVD process forms the silicon nitride layer to a thickness of about 50 to about 150 angstroms and the top silicon oxide layer to a thickness of about 50 to about 150 angstroms.

21. The process of claim 15, wherein the deposition process comprises LPCVD using a batch-type furnace.

* * * * *